United States Patent [19]

DesMarais, Jr.

[11] Patent Number: 4,457,861

[45] Date of Patent: Jul. 3, 1984

[54] METHOD, MATERIALS AND APPARATUS FOR MANUFACTURING PRINTED CIRCUITS

[75] Inventor: Raymond C. DesMarais, Jr., North Chelmsford, Mass.

[73] Assignee: Additive Technology Corporation, North Chelmsford, Mass.

[21] Appl. No.: 372,093

[22] Filed: Apr. 26, 1982

Related U.S. Application Data

[62] Division of Ser. No. 103,157, Dec. 13, 1979, Pat. No. 4,327,124.

[51] Int. Cl.³ .............................................. H05K 3/12
[52] U.S. Cl. .................................... 252/512; 523/200; 524/876; 427/96; 106/1.18
[58] Field of Search ........................ 252/512; 523/200; 524/876; 106/1.18

[56] References Cited

U.S. PATENT DOCUMENTS 3,391,455  7/1968  Hirohata et al. ................ 427/205 X
3,910,852  10/1975  Lederman et al. ................... 252/512
4,073,999  2/1978  Bryan et al. ..................... 427/226 X

OTHER PUBLICATIONS

Kirk–Othmer Encyclopedia of Chemical Technology, vol. 15, p. 176, 2nd edition, ©1968, John Wiley & Sons, Inc.

Primary Examiner—John D. Smith
Attorney, Agent, or Firm—Morse, Altman & Dacey

[57] ABSTRACT

Printed circuits are produced by an additive technique wherein a metal-loaded resinous ink is first printed on the board, the circuit next being covered with a conductive metal powder while the ink is still wet. The powder is then pressed into the ink and the circuit cured. Next, a solder stratum is alloyed with the powder as by a solder paste printed over the circuit and the board heated to cause the solder to alloy with the ink and powder substrates. A solder resist may then be applied selectively over the circuit and multiple layers of circuits may be built up on the board. The conductive ink is an epoxy resin loaded with a metallic powder, preferably copper, with a catalyst added to the ink. The solder paste is a lead-tin alloy containing antimony suspended in a binder and a flux.

The apparatus employed to carry out the procedure includes silk screens and a roller arrangement for pressing the metallic powder into the ink. The press includes a plurality of progressively harder rollers. The process may be used to manufacture original circuits, or to repair or make changes to conventional printed circuits.

2 Claims, 10 Drawing Figures

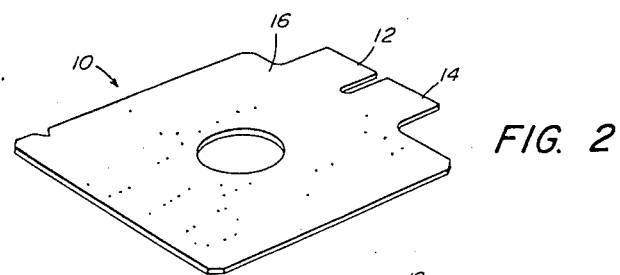
FIG. 2
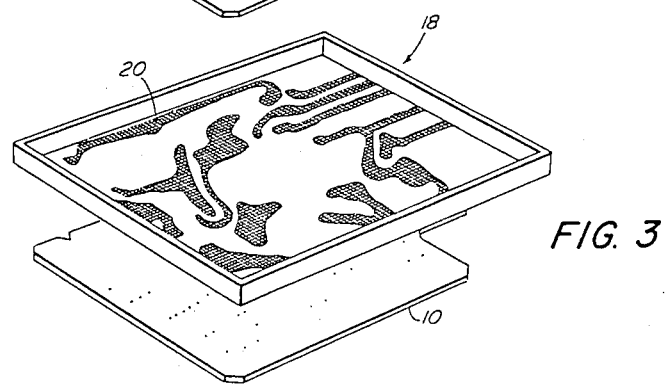
FIG. 3
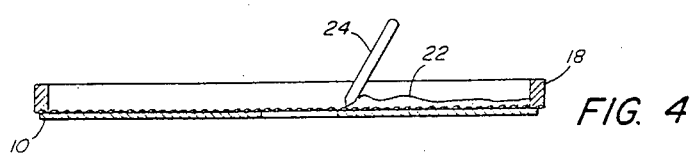
FIG. 4
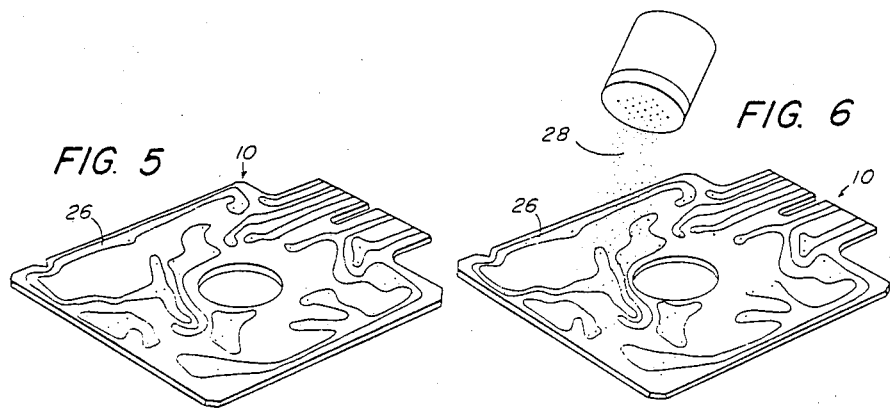
FIG. 5
FIG. 6

METHOD, MATERIALS AND APPARATUS FOR MANUFACTURING PRINTED CIRCUITS

This is a division of application Ser. No. 103,157 filed on Dec. 13, 1979, now U.S. Pat. No. 4,327,124.

BACKGROUND OF THE INVENTION

1. Field of the Invention

This invention relates generally to printed circuits and more particularly is directed towards a new and improved method for making, changing and repairing printed circuits, along with related materials and apparatus for use in connection therewith and circuits made thereby.

2. Description of the Prior Art

Conventional printed circuits are made by what may best be described as a subtractive procedure in which circuit boards laminated with one or more conductive strata are etched to remove some portions of a conductive layer, while other portions remain, according to a predetermined circuit design. The technique involves relatively complex photographic procedures requiring large capital investments for etching and plating equipment and related apparatus, such as cameras and the like. In general, the time required to design and produce a printed circuit with conventional techniques is quite long and requires a rather large number of skilled technicians. As a result, relatively few companies are capable of producing printed circuits using conventional techniques. Also, because of the time and expense involved in preparing a printed circuit, standard procedures are not appropriate for short production runs, even though the printed circuit may otherwise be more desirable.

Accordingly, it is an object of the present invention to provide improvements in the production of printed circuits. Another object of this invention is to provide a method for producing printed circuits quickly on a low-cost basis appropriate for both short and long production runs. Another object of this invention is to provide novel materials and associated apparatus for producing printed circuits by means of additive procedures. A further object of the invention is to provide improvements in printed circuits.

SUMMARY OF THE INVENTION

This invention features the method of producing printed circuits on a board and boards made thereby comprising the steps of printing a conductive metal-loaded ink onto a board in a predetermined circuit design, covering the printed design with a conductive metal powder, pressing the powder into the ink curing the ink, and removing excess powder. A conductive solder paste is then applied to the board over the printed circuit, or a portion thereof, and alloyed with the powder and ink.

This invention also features materials for producing additive printed circuits including a conductive ink comprised of an epoxy resin loaded with conductive metal powders, preferably copper, and a catalyst, as well as solder paste comprised of a lead-tin alloy with antimony in powder form suspended in a binder and a strong flux.

This invention also features a press for pressing the metal powder into the ink comprising a plurality of rollers of gradually increasing hardness to apply gradually increasing pressure to the board.

BRIEF DESCRIPTION OF THE DRAWINGS

FIG. 2 is a view in perspective of a typical board used for making a printed circuit according to the invention, FIG. 3 is a view in perspective showing a screen for use in printing a circuit onto the board, FIG. 4 is a sectional view in side elevation illustrating the preferred technique for applying the conductive ink to the board, FIG. 5 is a view in perspective showing a board printed with the conductive ink, FIG. 6 is a view in perspective showing the board being dusted with conductive powder.

DETAILED DESCRIPTION OF THE PREFERRED EMBODIMENTS

Figure 7:
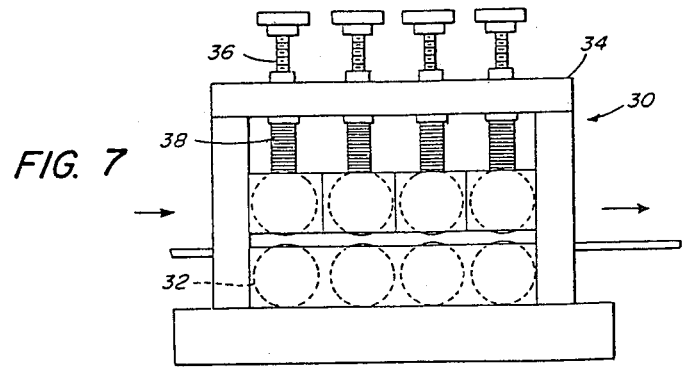
FIG. 7 is a sectional view in side elevation showing a pressing apparatus made according to the invention.
Figure 8:
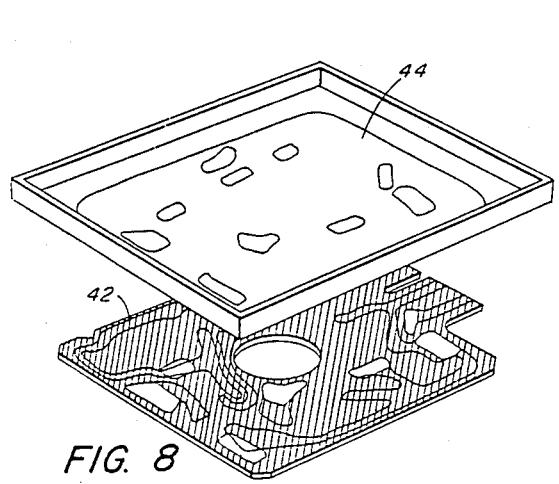
FIG. 8 is a view in perspective showing a screen for use in printing a solder resist onto the board.
Figure 1:
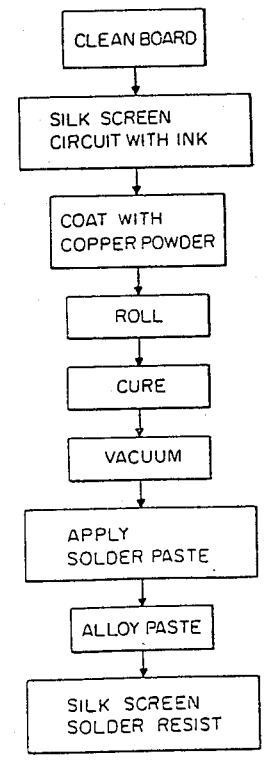
FIG. 1 is a flow diagram setting forth the steps involved in producing printed circuits according to the invention.

In accordance with the present invention, an electrically conductive circuit is printed on a supporting surface, such as a board 10, by means of adding circuit materials to the board. Typically, the board 10 may be fabricated from any one of a variety of materials suitable for printed circuit boards. Boards of this type must be electrically insulating and commonly are relatively thin and stiff although for some applications flexible supporting surfaces may be used. For this purpose boards of phenolic resins, fiberglass laminates, impregnated paperboard, or the like, may be used. Ideally, the board should be capable of withstanding heat from soldering operations, display electrical insulation characteristics, as well as resistance to physical shock and vibration. In any event, the board 10 is first formed into the desired shape, and in the illustrated embodiment the shape of the board is generally rectangular and formed with a pair of integral tongues 12 and 14 at one edge by means of which the board may be plugged into a chassis in the usual manner. This shape is only by way of example since many different shapes are used with and without tongues. If a large number of boards are to be produced, a number of circuits may be printed on a large sheet and subsequently cut into individual boards. The board is formed with a number of small holes 16 through which the leads of circuit components are passed after the circuit has been printed and to which components will be soldered. The plain board 10 initially is cleaned by a suitable solvent such as isoproponol, or methyl ethyl ketone.

With the board 10 cleaned and ready, a silk screen 18 is superimposed over the board 10 as suggested in FIGS. 3 and 4. The silk screen 18 bears the desired circuit pattern and, in practice, a silk screen fabricated from 160–180 mesh stainless steel has been found to give particularly satisfactory results. The pattern on the silk screen 18 is open at 20 where the circuit is to be printed on the board and is solid in those areas where no printing is to take place. With the silk screen 18 in operative position over the board 10, a conductive ink 22 is applied through the screen 18 onto the surface of the board 10, the ink passing through the open mesh areas 20 of the screen so that the circuit pattern is transferred onto the board as suggested in FIG. 5.

The ink 22, in accordance with the present invention, is a metal-loaded resin system and the ink includes a phenolic based resin loaded with a conductive metal powder, preferably a 325 mesh copper powder. The ink also includes an acid which acts as a catalyst in curing the ink, as well as serving to remove any oxides that may be present with the copper.

The ink may be applied to the board by hand, although for production purposes silk screening has been found to give the most satisfactory results since it produces a clean, sharp image and is relatively inexpensive. In FIG. 4 an applicator 24 may be used to spread the ink 22 over the screen so that the image passes through the screen onto the board. As shown in FIG. 5, the printed board 10 displays a circuit image comprised of circuit segments 26 corresponding to the circuit design on the silk screen 18, each circuit segment being printed by the ink 22.

While the ink in the circuit segments 26 printed on the board are still wet, the circuit segments are covered with a conductive metal powder 28 as by dusting, for example, and for this purpose 325 mesh copper powder has been found to give satisfactory results. The powder 28 should be dusted over the circuit pattern within a few minutes after the printing operation and preferably should be done within five minutes. An excessive amount of powder should be added to insure that the ink is fully covered by the powder, even though excess powder may be present on the board surface. Once the board has been fully dusted with the copper powder, it is passed through a roller press 30 shown in FIG. 7 which presses the copper powder 28 intimately into the ink of the circuit segments 26.

The press 30 includes a plurality of rolls 32 arranged in pairs, with each pair increasing in durometer hardness from one end to the other. Thus, for example, the first pair of rollers may have a durometer hardness of perhaps 45 while the next pair may have a hardness of 50, followed by a pair at 55, and a final pair at 60. The rollers are mounted to a rigid frame 34, with the lowermost rolls being driven by a common drive system to advance the board from left to right, as viewed in FIG. 7. The upper rolls are individually adjustable by means of screws 36 loaded by springs 38 applying pressure to the upper set of rolls. Thus, as the board 10 is fed into the bite of the first pair of rolls, the copper powder will be pressed down into the ink and the pressure gradually increases as the board feeds through the press. The pressing operation produces an intimate contact between the powder and the ink and, once the board has made one pass through the press, excess copper dust is removed and the board may be passed through again. By providing excess copper powder on the initial dusting, all of the printed circuit is covered by the powder and this insures against any of the ink being picked up and transferred to the rolls of the press. The end result is that the pressed circuit image remains crisp and clean. Further, there is a relation between the surface tension of the resin and the pressure applied by the rollers. By applying progressive pressure to the board a uniform surface is produced without distorting the image.

When the pressing operation is completed, the ink is then cured. In practice, the printed circuit may be given a preliminary cure at 70° C. to 90° C. for a period of 10 to 15 minutes and a final cure at 125° C. for one to two hours.

The curing may be carried out by various means such as a circulating air oven or use of infrared lamps, for example. When the ink has been fully cured, the circuit segments 26 bond tightly to the board 10 and the copper powder 28 has become an integral part of the circuit segments 26. Any loose or excess copper powder 28 is removed as by a vacuum or other suitable means.

The next step in the manufacture of the printed circuit is to apply a solder paste over the same circuit segments 26 which have been dusted with copper powder and now cured. A silk screen may be used for this purpose, similar to the screen 18 used to apply the printed ink initially onto the board, except a wider mesh screen is used such as a 90-100 SS mesh in a slightly larger image to insure full coverage of the circuit. The solder paste employed herein preferably is a composition made of a lead-tin alloy with antimony in powder form in a flux and a binder whereby the metal powders remain suspended in the paste. Two solder pastes that have been found satisfactory include a 60/40 solder with one percent ethylene glycol sold by Bow Solder Products Co., Inc. The second is a 60/40 paste produced by Electronic Fusion Devices, Inc. and identified as No. 2037. The paste has a creamy consistency and is printed onto the circuit in the same fashion as suggested in FIGS. 3 and 4 using the silk screen and applicator, as illustrated. The flux in the solder preferably should be very active and should be a strong inorganic acid. A preferred solder paste composition includes by weight percent zinc-chloride 3-6%, pre-alloyed lead-tin antimony 80% and a binder representing the balance. Once the solder paste has been applied it forms a solder stratum 40 on top of the circuit segments 26. Once the solder printing has been completed, the solder is alloyed with the underlying ink and copper powder by heating the circuit to the melting point of the solder, typically in the range of 325° C. to 550° C., depending upon the particular solder composition. The heating may be carried out by various means such as infrared lamps in association with a moving belt carrying the board at the rate of perhaps 10 feet per minute. In any event, the solder is heated to its melting point, causing it to alloy with the ink and copper powder to form a conductive printed circuit on the board. The application of the solder onto the underlying ink and copper powder greatly increases the conductivity of the circuit and serves to mate the solder tightly to the board.

Once the alloying operation has been completed, a pattern of solder resist 42 may be applied selectively over the printed circuit and the board. The solder resist is a dielectric material which serves to insulate those portions of the board which are not to be exposed to whatever contacts, leads, etc., that are to be subsequently applied to the board. The solder resist typically may be an epoxy material and serves to prevent solder from a wave solder machine from adhering to other parts of the circuit when soldering parts to the board. The solder resist may be applied by silk screening techniques already described using a silk screen 44 having a desired pattern to appear on the circuit board. Normally, the solder resist pattern will differ from that of the circuit board insofar as certain portions of the circuit are to be covered while others are not.

The solder resist stratum may also serve as an insulator between successive layers of circuits which may be built up on one face of the board as suggested in FIG.

10. Different circuits may be applied over a solder resist substrate using the same techniques as applying the first circuit directly to the board. In practice, where a multiple circuit pattern is to be built up on one side of the board in successive layers, the solder paste layer 40 on the circuit nearest the board should have a higher melting point than the solder paste layers on the outer circuits so that the lowermost solder strata will not reflow or melt when the outermost circuits are being alloyed.

Figure 10:
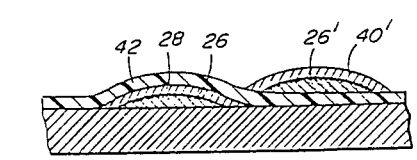
FIG. 10 is a view similar to FIG. 9 but showing a modification thereof.
Figure 9:
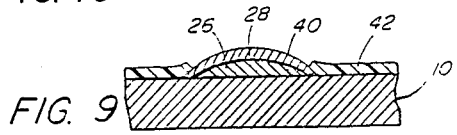
FIG. 9 is a detail cross-sectional view on an enlarged scale showing a portion of a printed circuit made according to the invention.

In FIG. 10 a board is shown with two layers of circuits built up one upon the other. The first circuit includes a circuit segment 26 which has been dusted with copper powder, cured and alloyed with a stratum of solder paste 40 with the circuit then covered with a solder resist stratum 42. Printed on top of the solder resist stratum 42 is another circuit segment 26' of conductive ink to which has been applied a dusting of copper powder and on top of which is a stratum 40' of solder paste alloyed with the ink and powder. The various superimposed printed circuits may cross over one another, or be built up in whatever number of layers may be required for the particular circuit. Using similar techniques the process may be employed to repair conventional printed circuit boards or to carry out engineering change orders on such boards.

The conductive ink employed in the process is a thermosetting resin which is loaded with electrically conductive metal powders. A preferred composition is a two-part system comprised of a phenolic (resorcinol) based resin loaded with copper powder and to which is added a catalyst such as anhydrous isopropanol and phosphoric acid. The anhydrous isoproponol should be pure and preferably should be on the order of at least 98% pure. Similarly the phosphoric acid should be of reagent grade. The anhydrous isoproponol not only acts as a catalyst but also serves as a partial thinner so as to provide viscosity control over the ink. While phosphoric acid is preferred, other inorganic acids may be used to advantage. The acid not only serves as a catalyst but also removes any oxides that may be present in the copper powder. Since the oxides inhibit conductivity it is desirable to eliminate any oxides that may be present.

The conductive ink of the preferred embodiment is prepared by first heating the phenolic resin (resorcinol) at 130° C. until the degree of polymerization is advanced to a stage that the resin has a taffy-like consistency. The viscosity of the resin may be adjusted using anhydrous isoproponol. Next, the copper powder is added and preferably this should be a 325 mesh, untreated, 200 RL grade copper powder. Sufficient copper powder is added to achieve 70–75% loading by weight. For example, for 100 grams total weight of ink, 25 grams would be the resin, while 75 grams represent the copper powder. If the material is not to be used immediately, it should be stored in a refrigerator at about 40° F. to inhibit further polymerization. When the material is to be used for printing, it is first brought up to room temperature and the catalyst is added and, preferably, the catalyst represents 6% by weight of the material. The preferred catalyst mixture is comprised of 3% phosphoric acid and 3% isoproponol.

Other materials used in the process may include anhydrous isoproponol for use as a thinner, as previously indicated, and also as a cleaner for the printing screens, as required. For this purpose a cleaner that has been found satisfactory is a mix of isoproponol and methyl ethyl ketone in equal proportions.

The solder paste may comprise a 60/40 composition of lead and tin with a 1% ethylene glycol additive. The solder may be made in a number of different compounds depending upon the desired melting point. The solder paste should be of a consistency to be screenable through a stainless steel mesh of the sort described.

While the foregoing invention has been described with particular reference to the illustrated embodiments, numerous modifications thereto will appear to those skilled in the art. For example, while various ranges, temperatures, times and other parameters have been described in connection with the preferred embodiment, variations thereto may be made with satisfactory results. For example, the flexibility of the printing ink may be controlled by adjusting the ratio between the epoxy and the phenols. Also, in lieu of the copper powder, other conductive metals, such as silver, aluminum, etc., may be used.

Further, instead of applying the copper powder by manual dusting it could be applied by vibratory feeders over a moving belt, electrostatically, or by other suitable means. Likewise, the solder stratum may be applied by wave solder techniques, or the like, instead of by printing with a silk screen, in which case the solder would alloy immediately to the copper powder stratum without a separate heating step. A further modification may be made by using a plain resinous ink without the metal filler, in which case all of the conductivity would be provided by the powder and solder strata.

Having thus described the invention, what I claim and desire to obtain by Letters Patent of the United States is:

1. An electrically conductive ink for use in printing an electrically conductive circuit on a dielectric surface, consisting essentially of:
 (a) a thermosetting resin;
 (b) conductive metal particles dispersed in said resin;
 (c) a catalyst;
 (d) said resin, said particles and said catalyst being present in said ink by weight percent respectively of approximately 23%, 71% and 6%;
 (e) said resin being a phenolic resin;
 (f) said particles being formed of copper having an average particle size of approximately 325 mesh;
 (g) said catalyst being comprised of substantially equal parts by weight of anhydrous isoproponol and an inorganic acid; and
 (h) said acid being phosphoric acid.

2. An electrically conductive ink, according to claim 1, wherein said resin is resorcinol.

* * * * *